United States Patent [19]

Muir et al.

Best Available Copy

[11] E Re. 30,764

[45] Reissued Oct. 6, 1981

[54] ELECTRICAL OUTPUT PEAK DETECTING APPARATUS

[75] Inventors: Andrew R. Muir, Wilton; Joseph A. Vergato, Monroe, both of Conn.

[73] Assignee: The Perkin-Elmer Corporation, Norwalk, Conn.

[21] Appl. No.: 105,844

[22] Filed: Dec. 20, 1979

Related U.S. Patent Documents

Reissue of:

[64] Patent No.: 4,086,651
Issued: Apr. 25, 1978
Appl. No.: 700,915
Filed: Jun. 29, 1976

[51] Int. Cl.[3] ..... G06F 15/20; H03K 5/20; G01J 3/28

[52] U.S. Cl. ..... 364/487; 307/351; 307/352; 328/151; 364/574

[58] Field of Search ..... 364/487, 574, 570, 807; 328/151; 307/351, 352; 356/302, 319; 324/103 R; 340/146.2

[56] References Cited

U.S. PATENT DOCUMENTS

| | | | |
|---|---|---|---|
| 3,412,330 | 11/1968 | Klaver | 324/103 R |
| 3,413,491 | 11/1968 | Reeves et al. | 307/351 |
| 3,767,938 | 10/1973 | Kueper | 328/151 |
| 3,845,465 | 10/1974 | Hosick et al. | 340/146.2 |
| 3,961,898 | 6/1976 | Neeley et al. | 364/807 |
| 3,968,447 | 7/1976 | Baylac et al. | 328/151 |
| 3,972,617 | 8/1976 | Shibata et al. | 364/570 |

OTHER PUBLICATIONS

Mesples, P. M. et al.; "Measuring the Internal Thermal Resistance of Transistors and Integrated Circuits"; IBM Tech. Disc. Bull., vol. 12, No. 4, 9/1969, p. 550.

*Primary Examiner*—Errol A. Krass
*Attorney, Agent, or Firm*—S. A. Giarratana; F. L. Masselle; R. A. Hays

[57] ABSTRACT

Anticipation signals are derived for each peak whenever a differential exists within a closed loop having the electrical output connected to the input thereof and a confirmation signal is derived after each peak at a threshold level of the new slope polarity exceeding the noise level of the electrical output. The amplitude of each peak is stored as a voltage level which follows the electrical output throughout either slope polarity until a peak is reached and this voltage level is continuously compared with the electrical output to derive the slope polarity thresholds. Otherwise, a very particular embodiment is disclosed with which the stored voltage level only relates to either the most significant maximum or minimum peak of the electrical output and the disclosed embodiments are related to instruments which perform spectral analysis.

9 Claims, 3 Drawing Figures

ELECTRICAL OUTPUT PEAK DETECTING APPARATUS

Matter enclosed in heavy brackets [ ] appears in the original patent but forms no part of this reissue specification; matter printed in italics indicates the additions made by reissue.

BACKGROUND OF THE INVENTION

This invention relates to electrical output peak detecting apparatus and particularly such apparatus for use with analytical instruments. Apparatus for detecting electrical output peaks are commonly known. However, most of these apparatus provide erroneous peak indications when the electrical output includes noise. Otherwise, prior art apparatus avoid the affects of noise by time delaying the indication of peaks but this technique adversely affects the accuracy of peak detection. Although accuracy may be compromised in some peak detection applications, such compromise must be generally avoided in analytical instruments and especially instruments for spectral analysis wherein the electrical output thereof relates to the analyzed parameter which is dependent on a time varying spectral parameter.

SUMMARY OF THE INVENTION

It is the object of this invention to improve the accuracy at which the peaks of a noise laden electrical output are detected.

It is another object of this invention to incorporate the peak detecting apparatus thereof with a spectrophotometer having a microcomputer and printer to record both the amplitude of output peaks and the radiation frequency at which they occur.

It is a further object of this invention to detect the most significant maximum or minimum peak of an electrical output over a continuous duration.

These objects are accomplished according to the present invention by connecting the output of a comparator to the input of a sample and hold means through a polarized switching means which is controlled by a logic means in accordance with slope polarity thresholds of the electrical output. The sample and hold means output is connected to one input of the comparator while the electrical output is connected to the other input thereof, and comparator output is connected along with the sample and hold means output to enable a peak anticipation signal means when a differential exists therebetween. Furthermore, the slope polarity thresholds are derived from both the sample and hold means output and the electrical output by the control logic means which also derives a peak confirmation signal therefrom. When the most significant maximum or minimum peak of the electrical output over a continuous duration is desired, the polarized switching means is controlled so that only positive or negative inputs respectively are connected to the sample and hold means, while the peak anticipation and confirmation signals are either disabled or ignored. In spectral analysis applications, the peaks are correlated with the spectral parameter by connecting the peak anticipation signal to enable storage of this information in a microcomputer and by connecting the peak confirmation signal to enable print-out of such information.

BRIEF DESCRIPTION OF THE DRAWINGS

The manner in which these and other objects of the present invention are achieved will be best understood by reference to the following description, the appended claims, and the attached drawings wherein:

DESCRIPTION OF THE PREFERRED EMBODIMENTS

Figure 1:
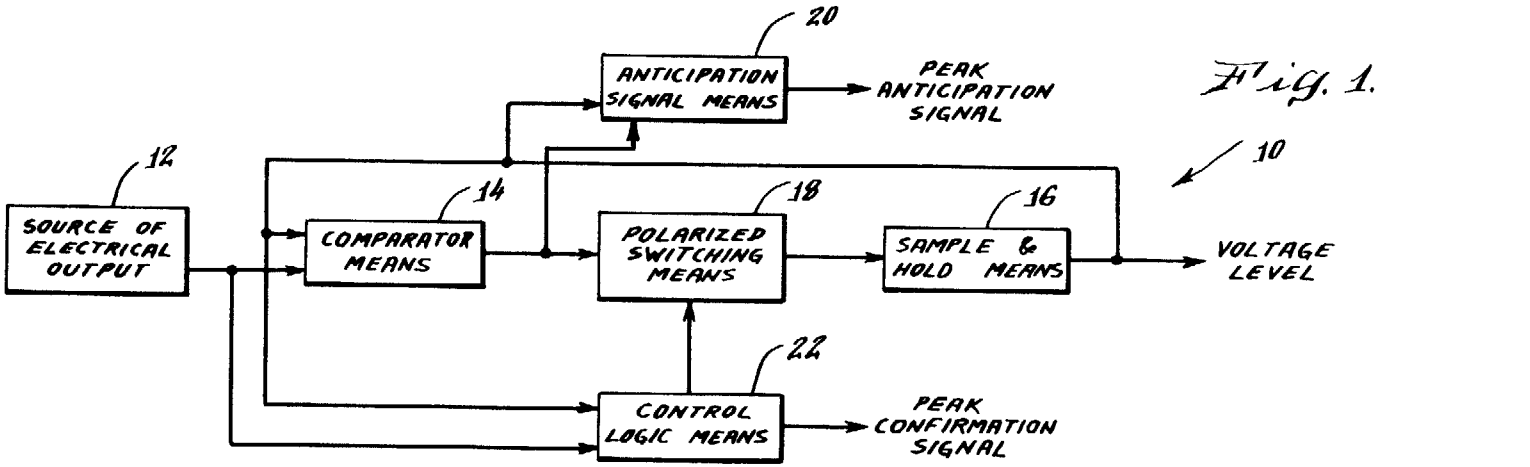
FIG. 1 is a block diagram relating to the peak detecting apparatus of this invention.

Turning now to the drawings, the block diagram of FIG. 1 relates to the peak detecting apparatus 10 of this invention wherein the electrical output from a source 12 is connected to one input of a means 14 for differentially comparing that electrical output with a voltage level. The input to a sample and hold means 16 for storing this voltage level is connected to the output of the comparator means 14 through a switching means 18 for polarizing that output. The [electrical] output from [source 12] *comparator means 14* and the stored voltage level are also connected to [both] a means 20 for deriving a peak anticipation signal when a differential exists therebetween [and]. *The electrical output from source 12 and the stored voltage level are connected to* a logic means 22 for both controlling the polarized switching means 18 in accordance with slope polarity thresholds of the electrical output and deriving a peak confirmation signal at those thresholds.

Figure 2:
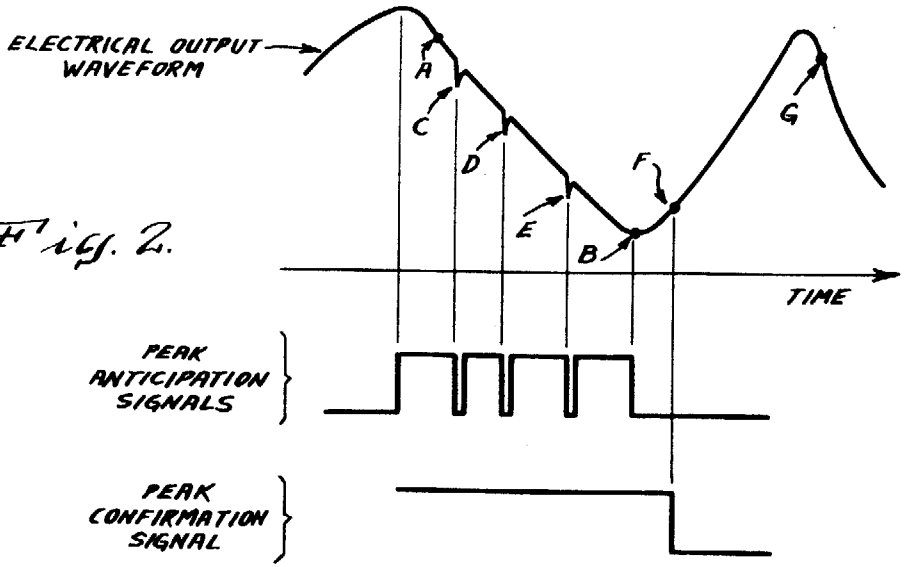
FIG. 2 is a timing diagram showing when both the peak anticipation and confirmation signals are derived for the minimum peaks of a typical noise laden electrical output waveform with the apparatus of FIG. 1.

A combination of signals to detect either maximum or minimum peaks is produced by the apparatus 10 of FIG. 1 and the operation of this apparatus will only be evaluated for minimum peak detection relative to the electrical output waveform of FIG. 2, with the understanding that similar operation is possible for maximum peak detection. Of course, the electrical output must be of negative slope before a minimum peak and at some predetermined negative slope polarity threshold (point A in FIG. 2), the control logic means 22 causes the polarized switching means 18 to connect the output from the comparator means 14 at the input of the sample and hold means 16. Thereafter, the voltage level output from the sample and hold means 16 follows the electrical output until a minimum peak (point B in FIG. 2) is reached, afterwhich the voltage level equalling the electrical output at that minimum peak is stored. During the negative slope period prior to the minimum peak, the peak anticipation means 20 generates a signal whenever the [electrical] *comparator means 14* output is more negative than the output from the sample and hold means 16. If the electrical output includes noise, such a differential will be experienced from the negative slope polarity threshold (at point A) to the minimum peak (at point B) except for when noise spikes (points C, D and E in FIG. 2) occur, so that a multiplicity of peak anticipation signals will most likely be derived prior to the occurrence of each minimum peak. In the typical peak detecting application, the electrical output is recorded at each peak anticipation signal. Of course, the electrical output must be of positive slope after the minimum peak and at some predetermined positive slope polarity threshold (point F in FIG. 2), the control logic means 22 generates a peak confirmation signal and causes the polarized switching means 18 to disconnect the input of the sample and hold means 16 from the output of the comparator means 14 relative to the minimum peak. In the typical peak detecting application, the peak confirmation signal is connected to print out the electrical output that was recorded by the last occurring peak anticipation signal at the minimum peak. Of course, peaks could be detected with the apparatus 10 of FIG. 1 when the electrical output is not laden with noise but where such noise does exist, both the negative and positive slope polarity thresholds of the control logic means 22 are set at levels greater than the noise level.

Figure 3:
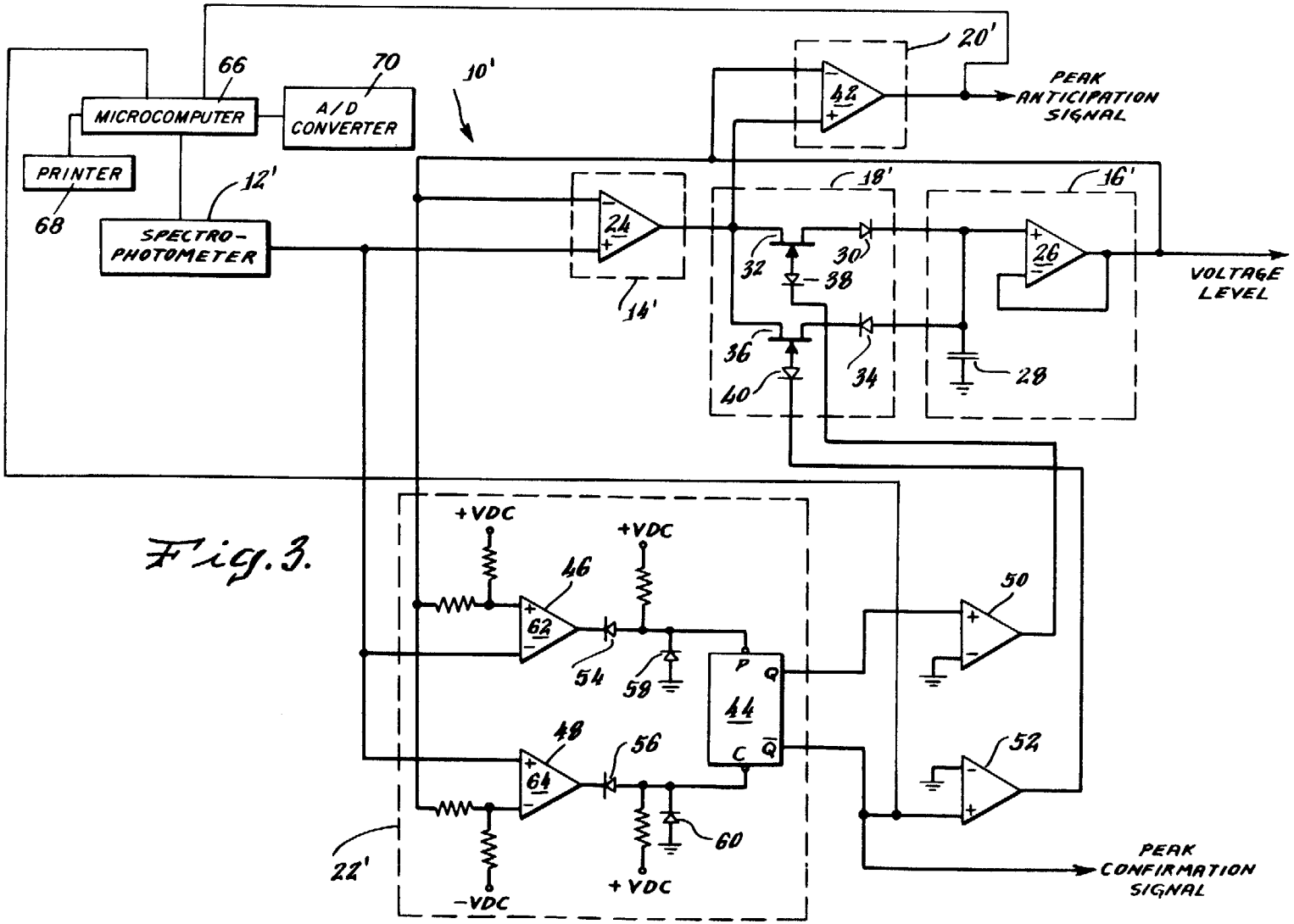
FIG. 3 is a schematic diagram relating to a specific embodiment of the invention.

Although many applications exist for the peak detecting apparatus of this invention, one particularly appropriate application therefor is found in analytical instruments. Furthermore, many circuit embodiments are possible for the block diagram of FIG. 1, however, one particularly appropriate circuit for use in spectrophotometers is illustrated in FIG. 3 where the block elements of FIG. 1 are identified by their same numerals but with a prime (') added. Concentrations of various constituents in sample substances are analyzed with spectrophotometers in which a spectrum of radiation is passed through the sample and the constituent concentration is determined by the frequency band at which either maximum absorption (A) or minimum transmission (T) of the radiation occurs. Spectrophotometers produce an electrical output in proportion to either A or T so that the maxima or minima peaks respectively of such output must be very accurately determined for such analysis.

Therefore, a spectrophotometer 12' produces the electrical output in FIG. 3 and is connected to the noninverting input of an operational amplifier 24 which is utilized as the comparator means 14'. The inverting input of operational amplifier 24 is connected to the voltage level output from the sample and hold means 16' which includes an operational amplifier 26 having its output shunt connected to the inverting input thereof and having the noninverting input thereof grounded through a capacitor 28. A parallel arrangement of a first diode 30 series connected with a first FET switch 32 and a second diode 34 series connected with a second FET switch 36 is included as the polarized switching means 18'. The gates of the FET switches 32 and 36 are connected through reversed biased diodes 38 and 40 respectively, so as not to draw gate current while the cathode and anode of diodes 30 and 34 respectively, are connected to the input of the sample and hold means 16' at the noninverting input of operational amplifier 26. The anticipation signal means 20' includes an operational amplifier 42 having the inverting and noninverting inputs thereof connected respectively to the outputs from operational amplifiers 26 and 24. A bistable flip-flop 44 having preset and clear inputs and complementary outputs Q and $\overline{Q}$, is included in the control logic means 22', along with a positive threshold comparator 46 and a negative threshold comparator 48. The complementary outputs Q and $\overline{Q}$ from flip-flop 44 are connected respectively to the gates of FET switches 32 and 36 through level boosting operational amplifiers 50 and 52 respectively. Outputs from the positive and the negative threshold comparators 46 and 48 are connected respectively to the preset and clear inputs of flip-flop 44 through diodes 54 and 56 respectively. The anode of each diode 54 and 56 connects to the flip-flop inputs, to a positive voltage reference, and to ground through reversed biased diodes 58 and 60 respectively. Positive threshold comparator 46 includes an operational amplifier 62 with the noninverting input thereof connected to a positive voltage reference and to the output of the sample and hold means 16', while the inverting input thereof connects to the electrical output of the spectrophotometer 12'. Negative threshold comparator 48 includes an operational amplifier 64 with the noninverting input thereof connected to the electrical output from the spectrophotometer 12', while the inverting input thereof connects to both a negative voltage reference and the output from the sample and hold means 16'.

The circuitry of FIG. 3 functions in the same general manner as was explained previously for the block diagram of FIG. 1 to produce the combination of anticipation and confirmation signals for either maxima or minima electrical output peaks from the spectrophotometer 12'. Of course, those skilled in the electrical arts will readily understand that each of the operational amplifiers 24, 26, 42, 50, 52, 62 and 64 is arranged to function conventionally. As will be explained later, one of the FET switches 32 or 36 is conductive at all times so that amplifier 24 operates to have substantially balanced inputs because the inverting input thereof is connected in a feedback arrangement to the voltage level at the output from sample and hold means 16'. Amplifier 26 in the sample and hold means 16' operates to hold its output at whatever level is applied to its noninverting input by capacitor 28 because the inverting input thereof is shunted to that output. Furthermore, the input impedance thereof is high, so that the voltage level at the output thereof can be applied without substantially discharging the capacitor 28 when neither diode 30 nor 34 is forward biased. Amplifier 42 in the peak anticipation signal means 20' operates to produce a saturated output level having a polarity in accordance with the differential that exists between the inputs thereof. Both amplifiers 50 and 52 operate to produce a saturated output level having a polarity in accordance with the level at the noninverting inputs thereof because the inverting inputs thereof are grounded. Each amplifier 62 and 64 in the control logic means 22' operates to produce a saturated output level having a polarity in accordance with the offset differential that exists between the inputs thereof and the amount of offset is determined by the voltage reference at the respective inputs thereof. Of course, flip-flop 44 operates to produce low level Q and high level $\overline{Q}$ outputs when the clear input is at low level while the preset input is at high level, or to produce high level Q and low level $\overline{Q}$ outputs when the clear input is at high level while the preset input is at low level.

Similar to the previous evaluation regarding apparatus 10 of FIG. 1, the circuitry of FIG. 3 will only be evaluated for minimum peaks using the electrical output waveform of FIG. 2, with the understanding that maximum peaks are also detectable therewith. At the negative slope polarity threshold (point A in FIG. 2), FET 36 in the polarized switching means 18' becomes conductive to connect output from the comparator means 14' with input to the sample and hold means 16' through diode 34. This negative slope polarity threshold is initiated by amplifier 64 which only develops a negative output when the electrical output from spectrophotometer 12' is less than the voltage level output from the sample and hold means 16' by a differential greater than the negative voltage reference at the inverting input to amplifier 64. Of course, this negative output from amplifier 64 renders diode 56 conductive to cause a low level at the clear input of flip-flop 44, while the preset input thereof remains at a high level due to diode 58 being reversed biased by the positive voltage reference. Thereof, a high level appears at the $\overline{Q}$ output of flip-flop 44 to cause a positive output from amplifier 52 which thereby renders FET 36 conductive. Except for the noise spikes (points C, D and E in FIG. 2), both FET 36 and diode 34 remain conductive thereafter until the minimum peak (point B in FIG. 2) is reached so that the voltage level at the output of the sample and hold means 16' substantially follows the decreasing electrical output to the minimum peak. Although FET 36 is continuously conductive beyond the minimum peak, diode 34 becomes reversed biased at each noise spike and the minimum peak, with the sample and hold means 16' operating to store the lowest electrical output reached prior to each such reverse biased condition.

Whenever the electrical output from the spectrophotometer 12' is more negative than the output from the amplifier 26 during the negative slope period prior to the minimum peak, a differential results between the inputs of amplifier 42 to cause a signal from the peak anticipation means 20'. After passing through the minimum peak, the electrical output then approaches the positive slope polarity threshold (point F in FIG. 2) at which FET 32 in the polarized switching means 18' becomes conductive to connect the input of the sample and hold means 16' with the output from the comparator means 14', while FET 36 becomes nonconductive. This positive slope polarity threshold is initiated by amplifier 62 which only develops a negative output when the electrical output from spectrophotometer 12' is greater than the voltage level output from the sample and hold means 16' by a differential greater than the positive voltage reference at the noninverting input to amplifier 62. Of course, this negative output from amplifier 62 renders diode 54 conductive to cause a low level at the preset input of flip-flop 44, while the clear input thereof remains at a high level due to diode 60 being reversed biased by the positive voltage reference. Therefore, a low level which constitutes the peak confirmation signal, appears at the $\overline{Q}$ output of flip-flop 44 to cause a negative output from amplifier 52 which thereby renders FET 36 nonconductive until the next negative slope polarity threshold (point G in FIG. 2) is reached. Of course, a maximum peak will always appear before the next negative slope polarity threshold and those skilled in the art will understand without further explanation that the circuitry of FIG. 3 could be operated in a manner similar to that discussed above for detecting such maximum peaks. Furthermore, the artisan will realize that diodes 38 and 40, amplifiers 50 and 52, diodes 54 and 56 along with the positive voltage reference on the anodes thereof and diodes 58 and 60 are not critical to the circuitry of FIG. 3.

The circuitry of FIG. 3 can be simplified to detect either the most significant maximum or minimum peak respectively by rendering FET switch 32 or 36 conductive and rendering FET switch 36 or 32 nonconductive, while either disabling or ignoring the peak anticipation and confirmation signals. Therefore, output from the comparator means 14' is connected to the input of the sample and hold means 16' through diode 30 when the most significant maximum electrical output peak is desired and through diode 34 when the most significant minimum peak is desired. Otherwise, the circuitry of FIG. 3 can be utilized in spectrophotometers which have the radiation frequency spectrum there of controlled by a microcomputer 66 and a printer 68 to record information. In such an arrangement, the peak anticipation and confirmation signals are connected to the computer 66 along the voltage level output from sample and hold means 16' through an analog/digital converter 70. The microcomputer 66 is programmed to store both the radiation frequency and the voltage level output from the sample and hold means 16' upon receiving the peak anticipation signal and to pass such information relating to the last occurring peak anticipation signal to the printer 68 upon receiving the peak confirmation signal.

Those skilled in the art will understand that the present disclosure has been made by way of example and that numerous changes in the details of construction and the combination or arrangement of parts may be resorted to without departing from the true spirit and the scope of this invention. Therefore, the present disclosure should be construed as illustrative rather than limiting.

What we claim is:

1. Circuitry for generating an anticipation signal and a confirmation signal relative to peak amplitudes of a varying electrical output, comprising:

sample and hold means for storing a voltage level;

means for differentially comparing the electrical output with said voltage level;

switching means for polarizing and connecting the output of said comparator means to the input of said sample and hold means;

means for deriving the anticipation signal when a differential exists between said voltage level and the [electrical output] *output of said comparator*; and logic means for controlling said polarized switching means in accordance with slope polarity thresholds of the electrical output relative to said voltage level and deriving the confirmation signal at said thresholds.

2. The circuitry of claim 1 wherein said sample and hold means includes an operational amplifier having inverting and noninverting inputs and an output, said output thereof being shunted to said inverting input thereof and said noninverting input thereof being grounded through a capacitor.

3. The circuitry of claim 1 wherein said comparator means includes an operational amplifier having inverting and noninverting inputs and an output, said noninverting input thereof being connected to the electrical output and said inverting input thereof being connected to the output of said sample and hold means.

4. The circuitry of claim 1 wherein said polarized switching means includes first and second diodes separately connected in series respectively with first and second FET switches between the output of said comparator means and the input of said sample and hold means with the cathode of said first diode and the anode of said second diode being connected to that input; the gate of said first FET switch being connected to a positive slope polarity threshold from said control logic means and the gate of said second FET switch being connected to a negative slope polarity threshold from said control logic means.

5. The circuitry of claim 1 wherein said anticipation signal means includes an operational amplifier having inverting and noninverting inputs and an output, said noninverting input thereof being connected to the output of said comparator means and said inverting input thereof being connected to the output of said sample and hold means.

6. The circuitry of claim 1 wherein said control logic means includes first and second operational amplifiers and a bistable flip-flop having preset and clear inputs and complementary outputs, said first operational amplifier having inverting and noninverting inputs and an output, said noninverting input thereof being connected to a positive voltage reference and to said voltage level while said inverting input thereof is connected to the electrical output, said second operational amplifier having inverting and noninverting inputs and an output, said noninverting input thereof being connected to the electrical output while said inverting input thereof is connected to a negative voltage reference and to said voltage level, said preset input being connected to the output of said first operational amplifier and said clear input being connected to the output of said second operational amplifier, said complementary outputs being connected to said polarized switching means.

7. Circuitry for deriving the amplitude of the most significant peak relative to a varying electrical output, comprising;

sample and hold means for storing a voltage level;

means for differentially comparing the electrical output with said voltage level;

switching means for polarizing and connecting the output of said comparator means to the input of said sample and hold means; and means for controlling said polarized switching means so that only positive inputs are connected to said sample and hold means when the most significant maximum peak is desired and only negative inputs when the most significant minimum peak is desired.

8. In an analytical instrument having an electrical output, the improvement comprising:

sample and hold means including a first operational amplifier with inverting and noninverting inputs and an output, said output thereof being shunted to said inverting input thereof and said noninverting input thereof being grounded through a capacitor;

a first comparator including a second operational amplifier with inverting and noninverting inputs and an output, said noninverting input thereof being connected to the electrical output and said inverting input thereof being connected to the output of said sample and hold means;

a second comparator including a third operational amplifier with inverting and noninverting inputs and an output, said noninverting input thereof being connected to the output of said first comparator and said inverting input thereof being connected to the output of said sample and hold means;

a positive threshold comparator including a fourth operational amplifier with inverting and noninverting inputs and an output, said noninverting input thereof being connected to a positive voltage reference and to the output of said sample and hold means, while said inverting input thereof is connected to the electrical output;

a negative threshold comparator including a fifth operational amplifier with inverting and noninverting inputs and an output, said noninverting input thereof being connected to the electrical output, while said inverting input thereof is connected to a negative voltage reference and to the output of said sample and hold means;

a bistable flip-flop having preset and clear inputs and complementary outputs, said preset input being connected to the output of said positive threshold comparator and said clear input being connected to the output of said negative threshold comparator;

a first diode series connected with a first FET switch between the output of said first comparator and the input to said sample and hold means with the cathode of said first diode being connected to that input and the gate of said first FET switch being connected to the output from said flip flop; and a second diode series connected with a second FET switch between the output of said first comparator and the input to said sample and hold means with the anode of said second diode being connected to that input and the gate of said second FET switch being connected to the complementary output from said flip-flop;

whereby peak anticipation signals are derived at the output of said second comparator when a differential exists between the electrical output and the output of said sample and hold means, while peak confirmation signals are derived at the complementary output of said flip-flop when positive and negative levels respectively of said threshold comparator are reached.

9. The combination of claim 8 wherein the analytical instrument is a spectrometer including a microcomputer through which the radiation frequency spectrum of the spectrometer is controlled and a printer to record information from said computer; and wherein said peak anticipation and confirmation signals are connected to said computer along with the output of said sample and hold means which is connected through an analog/digital converter, each said peak anticipation signal causing storage of said sample and hold means output and the radiation frequency in said computer while each said peak confirmation signal causes said computer to pass the most recent sample and hold means output and radiation frequency information to said printer.

* * * * *